(12) United States Patent
Shimizu et al.

(10) Patent No.: US 7,352,060 B2
(45) Date of Patent: Apr. 1, 2008

(54) MULTILAYER WIRING SUBSTRATE FOR PROVIDING A CAPACITOR STRUCTURE INSIDE A MULTILAYER WIRING SUBSTRATE

(75) Inventors: Noriyoshi Shimizu, Nagano (JP); Tomoo Yamasaki, Nagano (JP); Akio Rokugawa, Nagano (JP); Takahiro Iijima, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/128,813

(22) Filed: May 13, 2005

(65) Prior Publication Data

US 2005/0253248 A1 Nov. 17, 2005

(30) Foreign Application Priority Data

May 14, 2004 (JP) ............... 2004-145383

(51) Int. Cl.
*H01L 29/76* (2006.01)
*H01L 29/66* (2006.01)

(52) U.S. Cl. .............. 257/700; 257/E23.062; 257/23.077; 257/E23.097; 257/701; 257/528; 257/532; 257/288; 257/296; 257/773; 257/774; 257/E27.104; 257/E27.081; 257/E27.112; 257/E27.048; 257/698; 257/778; 361/306.1; 361/311; 361/782; 174/52.1; 174/260; 174/565

(58) Field of Classification Search ........ 257/E23.062, 257/E23.77, E23.079, E27.104, E27.081, 257/E27.112, E27.048, E23.068, E23.069, 257/E23.101, E25.012, E21.511, 700, 701, 257/528, 532, 535, 295, 296, 698, 778, 773, 257/774; 361/306.1, 311, 782; 174/52.1, 174/260, 565

See application file for complete search history.

(56) References Cited

U.S. PATENT DOCUMENTS

| | | | |
|---|---|---|---|
| 5,741,721 A * | 4/1998 | Stevens ................ | 438/396 |
| 6,614,663 B1 * | 9/2003 | Yokota et al. ......... | 361/780 |
| 6,764,931 B2 | 7/2004 | Iijima et al. | |
| 7,002,075 B2 * | 2/2006 | Kambe et al. ......... | 174/565 |
| 7,056,800 B2 * | 6/2006 | Croswell et al. ....... | 438/381 |
| 7,100,277 B2 * | 9/2006 | Borland et al. ......... | 29/832 |
| 7,161,793 B2 * | 1/2007 | Kurihara et al. ...... | 361/306.3 |
| 2003/0082846 A1 * | 5/2003 | Yoneda et al. ......... | 438/106 |
| 2003/0151471 A1 * | 8/2003 | Yamada et al. ........ | 333/193 |
| 2004/0211994 A1 * | 10/2004 | Ueda et al. ............ | 257/288 |
| 2005/0003199 A1 * | 1/2005 | Takaya et al. ......... | 428/413 |
| 2005/0111162 A1 * | 5/2005 | Osaka et al. .......... | 361/271 |
| 2006/0091494 A1 * | 5/2006 | Miyamoto et al. ..... | 257/532 |

FOREIGN PATENT DOCUMENTS

JP 2003-68923 3/2003

* cited by examiner

*Primary Examiner*—Alexander Oscar Williams
(74) *Attorney, Agent, or Firm*—Ladas & Parry LLP

(57) ABSTRACT

A multilayer wiring substrate for providing a capacitor structure inside a multilayer wiring structure is disclosed. The multilayer wiring substrate includes a dielectric layer including a resin material mixed with an inorganic filler, wherein the inorganic filler is fabricated by mixing a paraelectric filler with an inorganic filler having a high dielectric constant.

14 Claims, 6 Drawing Sheets

| | CHARACTERISTIC | | |
|---|---|---|---|
| | DIELECTRIC CONSTANT | TEMPERATURE COEFFICIENT(ppm/°C) | Q VALUE (1MHz) |
| $MgTiO_3$ | 16-18 | +100 | >5000 |
| $MgTiO_3-CaTiO_3$ | 17-45 | +100~-150 | >5000 |
| $2MgO \cdot SiO_2-SrO-BaO-TiO_2$ | 6-13 | +100~-1000 | >5000 |
| $La_2O_3 \cdot 2TiO_3$ | 35-38 | +60 | >5000 |
| $Bi_2O_3 \cdot 2TiO_2$ | 104-110 | -150 | >2000 |
| $CaTiO_3-La_3O_3-TiO_2$ | 100-150 | -470~-1000 | >3000 |
| $TiO_2$ | 90-110 | -750 | >5000 |
| $SrTiO_3-CaTiO_3$ | 240-300 | -1000~-2200 | >1500 |
| $CaTiO_3$ | 150-160 | -1500 | >1500 |
| $SrTiO_3$ | 240-260 | -3300 | >1500 |
| $BaTiO_3-SrTiO_3-La_2O_3-TiO_2$ | 360-650 | -3300~-4700 | >1500 |

MULTILAYER WIRING SUBSTRATE FOR PROVIDING A CAPACITOR STRUCTURE INSIDE A MULTILAYER WIRING SUBSTRATE

BACKGROUND OF THE INVENTION

1. Field of the Invention

The present invention generally relates to a multilayer wiring substrate and a method of manufacturing the multilayer wiring substrate, and more particularly to a multilayer wiring substrate and a method for manufacturing the multilayer wiring substrate having a semiconductor element mounted on a layer structure in which a capacitor is formed on multiple layered wiring patterns.

2. Description of the Related Art

In recent years and continuing, densification is performed on nearly every portion of a semiconductor device (semiconductor element). Accordingly, when disposing wiring patterns proximal to each other, it is important to prevent cross-talk between wires and fluctuation of electric potential in power lines, for example. Particularly, in a case of a multilayer wiring substrate mounted with a high frequency semiconductor element for enabling a high speed switching operation, cross-talk noise is liable to occur as the frequency of the semiconductor element increases. Furthermore, the rapid on and off switching of a switching element(s) of the semiconductor element causes switching noise to occur. This increases the possibility of fluctuation of electric potential in, for example, the power lines.

Conventionally, as a method for solving the problems, a separate capacity element (e.g. chip capacitor) is mounted on a multilayer wiring substrate, so as to provide a bypass condenser for decoupling unwanted coupling among the circuits of, for example, signal lines and power lines.

The conventional configuration, however, has the following problems.
(1) There is less design freedom of wiring patterns by mounting a separate chip capacitor or the like.
(2) If the distance between the chip capacitor and the electrode of the semiconductor element is long, inductance will increase. The increase of inductance prevents the chip capacitor from providing a sufficient decoupling performance. This causes a need to mount the chip capacitor or the like at a position as near as possible to the semiconductor element.
(3) The mounting position of the chip capacitor or the like is limited due to, for example, the size of the chip capacitor. Therefore, there is a limit in disposing the chip capacitor or the like at the vicinity of the semiconductor element.

Furthermore, mounting a capacity element (e.g. chip capacitor) on a multilayer wiring substrate causes difficulty in size-reduction/weight-reduction of the layer structure. This is contradictory to the current tendency toward further size-reduction and weight-reduction. Nevertheless, there is also a limit in size-reduction of the chip capacitor or the like.

In order to solve the foregoing problems, there is a method of obtaining a capacitor portion by electro-depositing a resin layer on a first wiring layer of an insulating substrate for using the resin layer as a dielectric layer, and thus using the first wiring layer and a second wiring layer including the resin layer formed on the insulating layer as electrode layers, respectively.

The multilayer wiring substrate fabricated by this method is able to provide a desired decoupling effect (controlling of crosstalk noise among wirings, potential change of power lines, etc.). Furthermore, since a portion that comprises the multilayer wiring substrate (first and second wiring layers, resin layer) also serves as the electrode layers and dielectric layer of the capacitor portion, size-reduction and cost-reduction of the multilayer wiring substrate can be achieved.

Furthermore, in fabricating the resin layer, a solvent, containing an organic resin dispersed in a colloidal state, is prepared in an electrolytic cell. Then, the insulating substrate having the first wiring layer formed thereto is steeped (dipped) into the electrolytic cell. Then, an electric field is applied between the first wiring layer and the electrolytic cell, thereby utilizing the electrophoresis of colloids caused by the applied electric field. In addition, the organic resin is mixed with an inorganic filler comprising a material of a high dielectric constant. This is shown in, for example, Japanese Laid-Open Patent Application No. 2003-68923.

However, the conventional multilayer wiring structure including the capacitor portion exhibits a capacitance change rate of −10% through 18% in the range of −55° C. through 125° C., as shown in FIG. 1. Furthermore, the resin layer serving as the dielectric layer has a temperature coefficient of 1555 ppm/° C. In this conventional multilayer wiring structure, an electro-deposition polyimide liquid containing high dielectric constant filler is used. The liquid contains a water-soluble polyimide resin being in a colloidal state along with minute particles of high dielectric constant inorganic filler uniformly dispersed therein. Further, a dielectric film including the liquid is deposited on a conductor and an electrode is formed on the dielectric film.

Therefore, the conventional multilayer wiring structure is unable to attain a stable capacitance change rate with respect to temperature in a case of forming the dielectric layer by employing a resin layer having high temperature coefficient. Furthermore, it is desired to maintain the capacitance change rate with respect to temperature at a constant value without having to rely on temperature change in high temperature ranges. Furthermore, improvement of temperature characteristics is desired, especially in a case where the multilayer wiring substrate including the capacitor portion is used for a filter circuit or the like.

SUMMARY OF THE INVENTION

It is a general object of the present invention to provide a multilayer wiring substrate and a method for manufacturing the multilayer wiring substrate that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a multilayer wiring substrate and a method for manufacturing the multilayer wiring substrate particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a multilayer wiring substrate for providing a capacitor structure inside a multilayer wiring structure, the multilayer wiring substrate including: a dielectric layer including a resin material mixed with an inorganic filler; wherein the inorganic filler is fabricated by mixing a paraelectric filler with an inorganic filler having a high dielectric constant.

In the multilayer wiring substrate according to an embodiment of the present invention, the multilayer wiring substrate may further include an upper electrode formed above the dielectric layer; and a lower electrode formed below the dielectric layer.

In the multilayer wiring substrate according to an embodiment of the present invention, the paraelectric filler may have a temperature coefficient that is a negative value.

In the multilayer wiring substrate according to an embodiment of the present invention, the paraelectric filler may have a temperature coefficient that is no more than 100 ppm/° C.

In the multilayer wiring substrate according to an embodiment of the present invention, the inorganic filler having a high dielectric constant includes at least one of barium titanate, lead zirconate titanate, and strontium titanate.

In the multilayer wiring substrate according to an embodiment of the present invention, the resin material may include an insulating resin made of polyimide resin.

Furthermore, the present invention provides a method of manufacturing a multilayer wiring substrate including the steps of: a) fabricating an inorganic filler by mixing a paraelectric filler with an inorganic filler having a high dielectric constant; b) forming a dielectric layer including a resin material mixed with the mixed inorganic filler on a substrate; c) forming an upper electrode above the dielectric layer; d) forming a lower electrode below the dielectric layer; and e) forming element connection pads in the upper and lower electrodes for connecting to an electrode of a semiconductor element.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
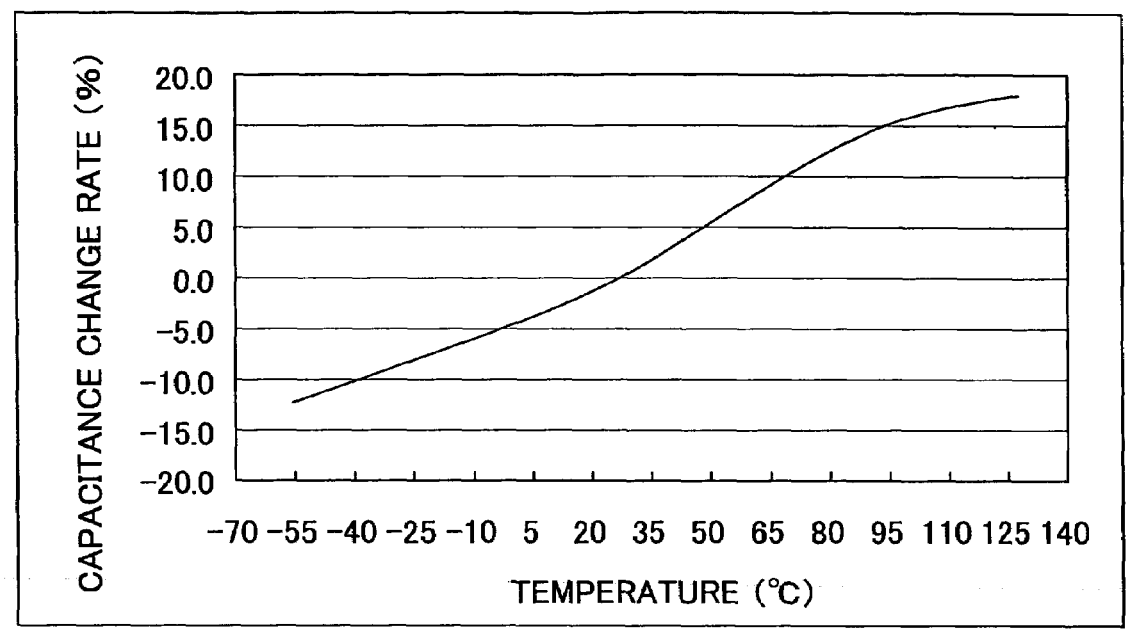
FIG. 1 is a graph showing a capacitance change rate with respect to temperature.
Figure 2:
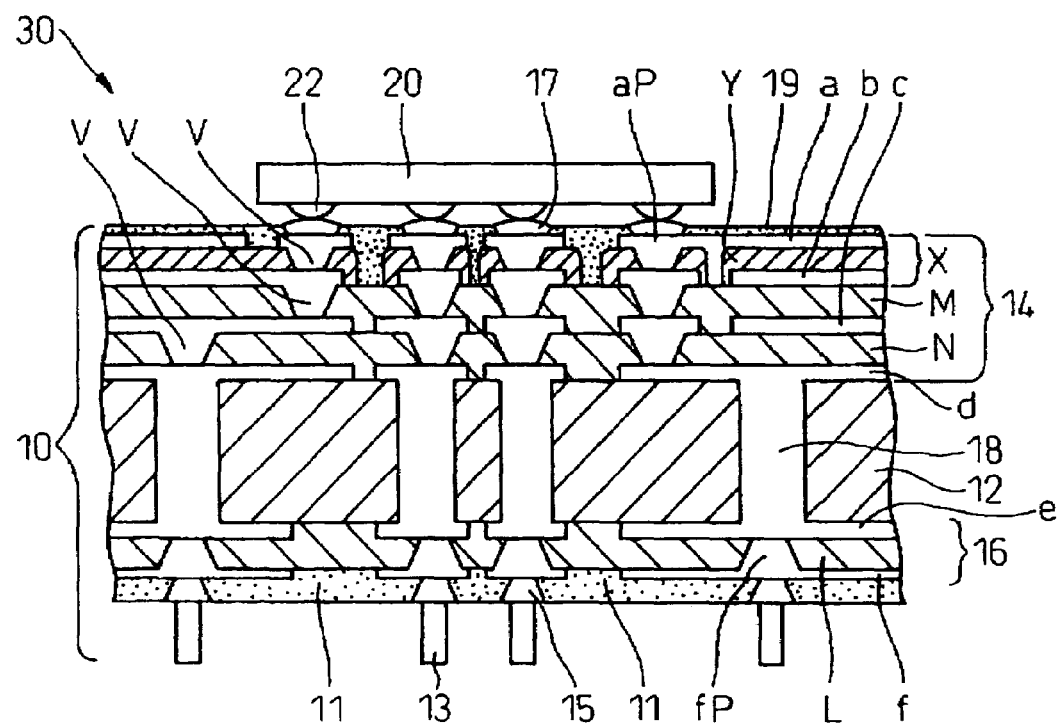
FIG. 2 is a cross-sectional view showing a semiconductor device having a semiconductor element mounted on a multilayer wiring substrate according to an embodiment of the present invention.

FIG. 2 is a cross-sectional view showing a portion of a semiconductor device 30 having a semiconductor element (semiconductor chip) 20 mounted on a multilayer wiring substrate 10 according to an embodiment of the present invention.

In FIG. 2, the multilayer wiring substrate 10 includes a multilayer wiring structure 14 having multiple wiring layers layered on an upper surface of an insulating substrate 12, a lower surface wiring structure 16 formed on a lower surface of the insulating substrate 12, and through holes 18 that electrically connects a lowermost layer d of the multilayer wiring structure 14 and an uppermost layer e of the lower surface wiring structure 16 by penetrating through the insulating substrate 12.

The lower surface wiring structure 16 includes two wiring layers e and f that are layered via an insulating layer L. External connection pads fP(s) are formed at predetermined portions of the wiring layer f being provided as the lowermost layer of the lower surface wiring structure 16. The external connection pads fP are connected to external connection terminals (pins) 13 via solder parts 15. For example, four pins 13 are illustrated in FIG. 2, in which the leftmost pin 13 may be a ground terminal (GR), the two pins 13 at the center may be signal terminals (S), and the rightmost pin 13 may be a power terminal (P). The lower surface of the lower surface wiring structure 16 is covered by solder resist 11 except at the areas of the solder parts 15.

The multilayer wiring structure 14 includes four wiring layers a, b, c, and d that are layered via a dielectric layer Y and/or insulating layers M and N. Each of the wiring layers a-d are electrically connected by providing a via hole(s) V at desired portions of the wiring layers, in which the via hole(s) are formed penetrating through the dielectric layer Y and/or the insulating layers M and N.

The uppermost portion of the multilayered wiring structure 14 is formed as a capacitor structure X. The capacitor structure X comprises an upper electrode layer including the wiring layer a, a dielectric layer Y, and a lower electrode layer including the wiring layer b. The dielectric layer Y is an electro-deposition layer including an insulating resin and an inorganic filler containing a mixture of a high dielectric constant inorganic filler and a paraelectric filler.

The paraelectric filler includes a paraelectric material having a temperature coefficient that is of a negative (minus) value or a small value. This considerably reduces the temperature coefficient of the dielectric layer Y. The reduction of temperature coefficient of the dielectric layer Y prevents the capacitance change rate from changing in correspondence with change of temperature, thereby, stabilizing the temperature characteristics. Accordingly, the capacitor structure X can be applied to, for example, a filter circuit.

Element connection pads aP are formed at predetermined portion of the upper electrode layer (wiring layer) a. The element connection pads aP are connected to electrode bumps 22 of the semiconductor element 20 via solder parts 17. In connecting the element connection pads aP to the electrode bumps 22 of the semiconductor element 20, the solder parts 17 are formed to the upper electrode layer a, for example, by coating the upper electrode layer a with solder paste with a screen printing method, or mounting solder balls on the upper electrode layer a, and then, melting the solder parts 17. The electrode bumps 22 are formed directly onto the electrode(s) of the semiconductor element by soldering; therefore, the electrode bumps 22 are substantially formed as a united body with the electrode(s) of the semiconductor element.

Furthermore, although not shown in FIG. 2, element connection pads bP are also formed at other predetermined portions of the upper electrode layer (wiring layer) a. The element connection pads bP are provided for connecting the lower electrode layer b to other electrode bumps 22 of the semiconductor element 20 via another wiring path. The upper surface of the upper electrode layer a is covered by solder resist 19 except at the areas of the solder parts 17.

Figure 3:
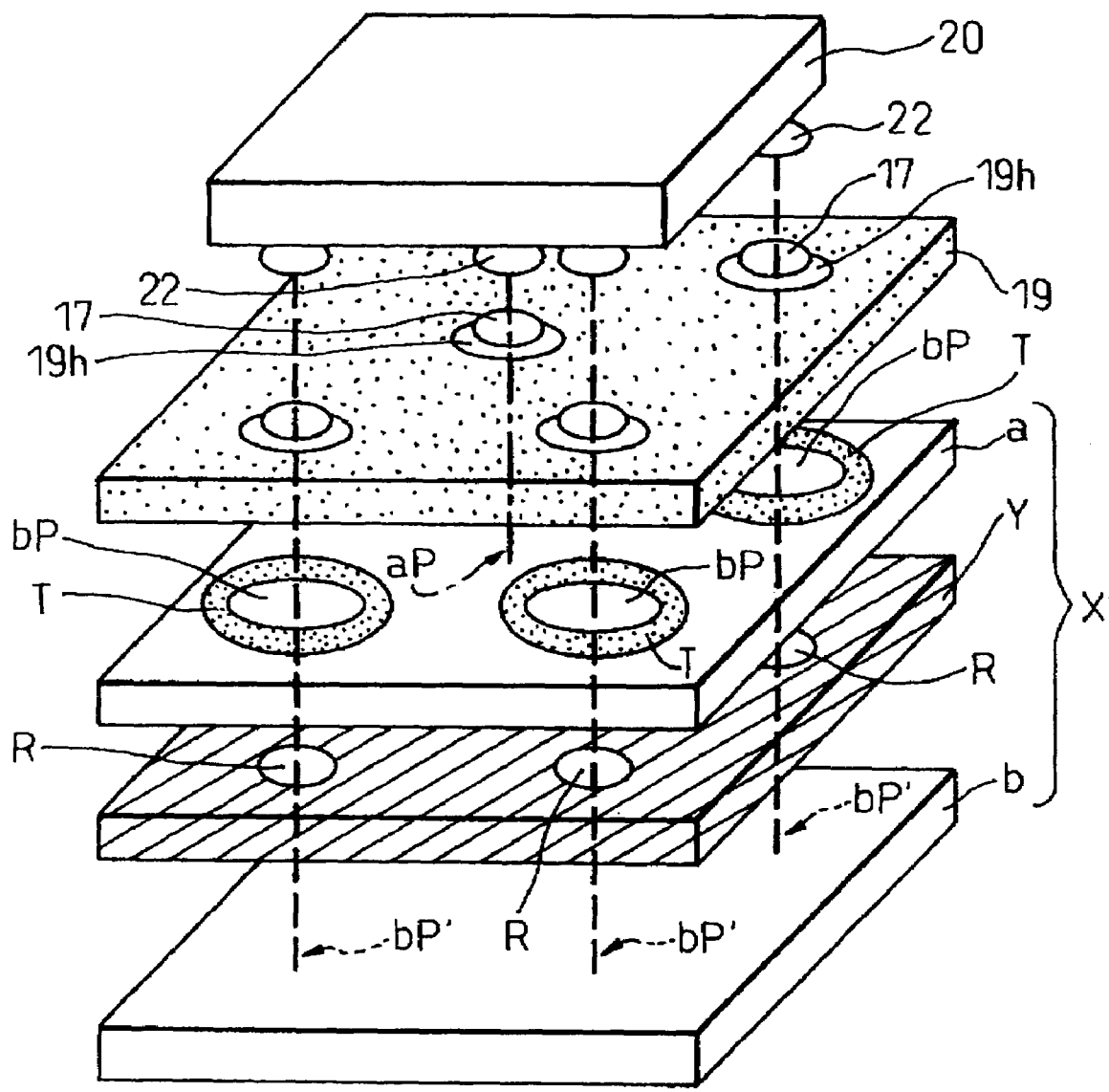
FIG. 3 is an exploded view showing a layer configuration of an inner capacitor of a multilayer wiring substrate according to an embodiment of the present invention.

FIG. 3 is a schematic exploded drawing showing an example of the connection between the capacitor X and the semiconductor chip 20 of the semiconductor device 30. FIG. 3 shows the semiconductor chip 20, the solder resist layer 19, the upper electrode layer a, the dielectric layer Y, and the lower electrode layer b being layered in this order from the top of FIG. 3. In this example, the upper electrode layer a is a power supply (power source) layer and the lower electrode layer b is a ground layer. Alternatively, the upper electrode layer a may be the ground layer and the lower electrode layer b may be the power supply (power source) layer.

Although multiple electrode bumps 22 are provided to the semiconductor elements, four bumps are illustrated in the drawings for the sake of convenience. The electrode bump 22, which is second from the left side of FIG. 3 (center of the semiconductor chip 20), is connected to the element connection pad aP of the upper electrode a of the capacitor X via the solder part 17 in an aperture 19h of the solder resist layer 19, as shown with a dot chain line in FIG. 3.

The semiconductor element 20 and the other remaining electrode bumps 22 are connected to each of the element connection pads bP that are isolated from the surrounding upper electrode layer a by annular insulation layers T in the upper electrode layer a. The isolated element connection pads bP are connected to respective connection parts bP" of the lower electrode layer b via scattered conductive layers in the dielectric layer Y.

That is, respective electrode bumps 22 of the semiconductor chip 20 mounted on the multilayer wiring substrate 10 are directly connected to the element connection pads aP and bP of the capacitor X situated immediately therebelow without having to pass through outside wiring paths surrounding the electrode bumps 22 and the element connection pads aP and bP.

Accordingly, substantially no increase of inductance is caused by the wiring of the semiconductor chip 20 and the capacitor X, and the anticipated decoupling effect of the capacitor X can be sufficiently attained.

Furthermore, since the dielectric layer Y of the capacitor X has an electro-deposition layer including a mixture of a high dielectric constant inorganic filler and an insulating resin, the dielectric layer Y can be formed as an extremely thin layer of no more than 10 μm, to thereby enable installment inside the multilayer wiring substrate 10. Accordingly, the multilayer wiring substrate 10 will be unaffected by the degree of freedom of the wiring patterns and size-reduction/weight-reduction of the multilayer wiring substrate 10 can be achieved.

Next, a process of manufacturing the multilayer wiring substrate 10 and the semiconductor device 30 according to an embodiment of the present invention is described with reference to FIGS. 4-12. It is to be noted that FIGS. 4-12 are cross-sectional view for describing each step in manufacturing the multilayer wiring substrate 10 and the semiconductor device 30 according to an embodiment of the present invention, respectively.

[Step 1]

Figure 4:
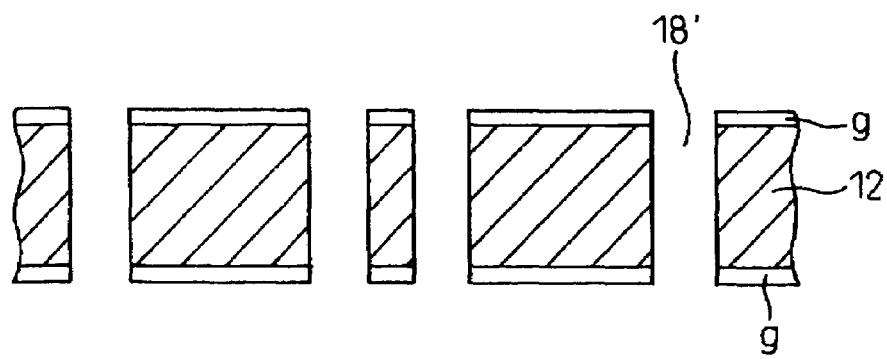
FIG. 4 is a cross-sectional view for describing Step 1 in manufacturing a multilayer wiring substrate and a semiconductor device according to an embodiment of the present invention.

Preparation of Substrate, Formation of Through-Hole (See FIG. 4)

A layer plate, being formed by adhering copper foil g on both sides of an insulating core material 12, is employed. Through-holes 18' are formed in the layer plate by using a drill or a laser. The layer plate may be, for example, FR-4 or the like, in which a glass fabric is impregnated with an insulating resin (e.g. epoxy resin, polyimide resin, BT (bismaleimide triazine) resin, PPE (polyphenylene-ehter) resin.

[Step 2]

Figure 5:
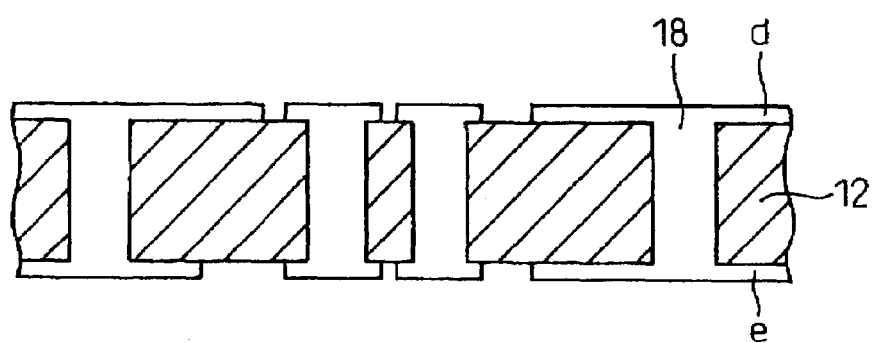
FIG. 5 is a cross-sectional view for describing Step 2 in manufacturing a multilayer wiring substrate and a semiconductor device according to an embodiment of the present invention.

Formation of Wiring Layers, Filling of Through-Holes (See FIG. 5)

A thin conductor layer (thin conductor layer for supplying electricity) is formed at the inner walls of the through-holes 18' and the entire copper foil g by using an electro copper plating method or a copper sputtering method. Then, by using an electro copper plating method, the through-holes 18' are filled with a conductor and a conductor layer is formed on both sides of the copper foil. Then, both sides of the copper foil and the conductor layer are subject to a patterning process. Thereby, wiring layers d and e are formed on the upper and lower faces of the insulating substrate 12. The through-holes 18', being filled with the conductor, serve to electrically connect the wiring layers d and e situated at the upper and lower faces of the insulating substrate 12.

[Step 3]

Figure 6:
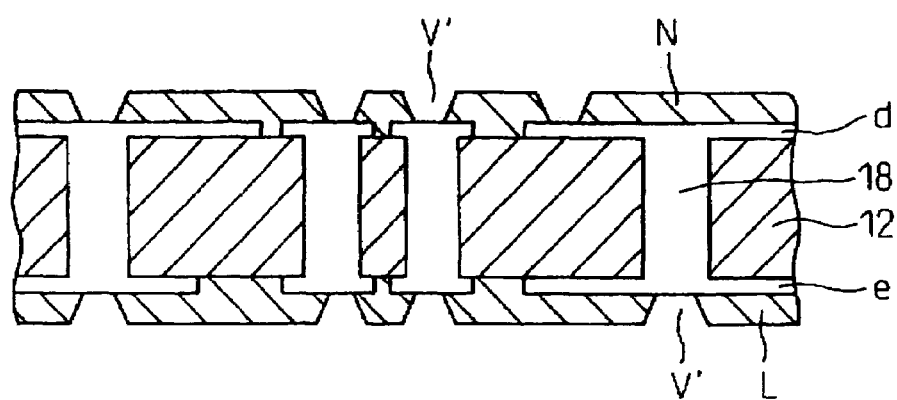
FIG. 6 is a cross-sectional view for describing Step 3 in manufacturing a multilayer wiring substrate and a semiconductor device according to an embodiment of the present invention.

Formation of Insulating Layers (See FIG. 6)

Insulating Layers N and L, serving to insulate the wiring layers d and e, are formed on the upper and lower faces of the configuration shown in FIG. 5 by coating the faces with resin (e.g. polyimide resin, epoxy resin) or by adhering sheets of such resin. Then, via holes V', serving to electrically connect the wiring layers d and e, are formed in the insulating layers N and L. The via holes V' are formed by using a laser, for example, a UV-YAG laser, a $CO_2$ laser, or an excimer laser.

[Step 4]

Figure 7:
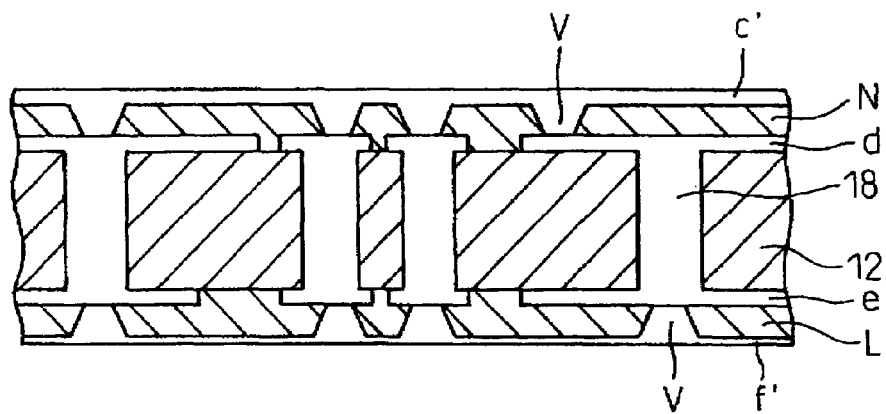
FIG. 7 is a cross-sectional view for describing Step 4 in manufacturing a multilayer wiring substrate and a semiconductor device according to an embodiment of the present invention.

Formation of Conductor Layers, Filling of Via Holes (See FIG. 7)

A thin conductor layer (thin conductor layer for supplying electricity) is formed at the upper and lower faces of the configuration shown in FIG. 6 by using, for example, an electro copper plating method or a sputtering method. Then, by using an electro copper plating method, the via holes V' are filled with a conductor and conductor layers c' and f' are formed on the upper and lower faces of the configuration shown in FIG. 6. The via holes V', being filled with the conductor, serve to electrically connect the wiring layers c' and f' situated at the upper and lower faces of the configuration shown in FIG. 6.

[Step 5]

Figure 8:
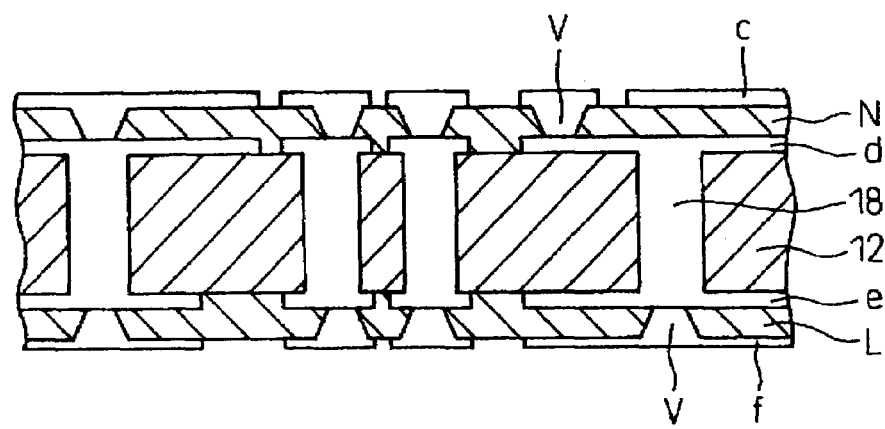
FIG. 8 is a cross-sectional view for describing Step 5 in manufacturing a multilayer wiring substrate and a semiconductor device according to an embodiment of the present invention.

Formation of Lower Electrodes (See FIG. 8)

The wiring layers c' and f' situated at the upper and lower faces of the configuration shown in FIG. 6 are patterned by using an etching method. This forms a second level of a wiring layer c at the upper face and a second level of wiring layer f at the lower face. The wiring layers c and f are electrically connected to the first levels of wiring layer d and e at predetermined areas via the via holes V'.

Subsequently, a multilayer wiring structure 14 is formed by repeating the Steps 3-5 depending on the desired number of levels of wiring layer that is desired to be formed.

[Step 6]

Figure 9:
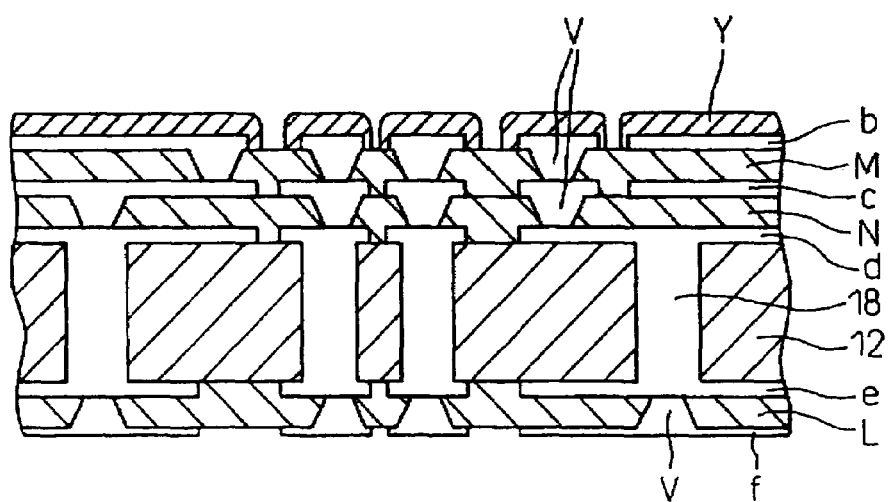
FIG. 9 is a cross-sectional view for describing Step 6 in manufacturing a multilayer wiring substrate and a semiconductor device according to an embodiment of the present invention.

Formation of Dielectric Layer (See FIG. 9)

After the Steps 3-5 are repeated (in this example, repeated once), an insulating layer M and a wiring layer b are formed above the wiring layer c. This allows a portion of the wiring layer b to be the lower electrode of the capacitor that is to be formed afterwards. After the surface of the wiring layer b is cleansed with an alkali or an acid material, a dielectric layer Y is formed on the wiring layer b by an electrodepositing method.

In one example, an electrolytic solution is prepared, in which the electrolytic solution contains a mixture of a polyimide resin (insulating resin) and an inorganic filler powder (containing a high dielectric constant inorganic filler and a paraelectric inorganic filler mixed in a predetermined proportion) that is dispersed in a colloidal state. The substrate, having its upper face masked (not shown) except at areas of the wiring layer b, is steeped in the electrolytic solution. The colloids of the mixture is subject to electrophoresis by applying an electric field between the substrate serving as a cathode side and an opposite anode side. This allows an electro-deposition layer including a mixture of the inorganic filler and the polyimide resin to be deposited on the upper face of the substrate, to thereby form the dielectric layer Y. This electrolytic process of depositing the mixed electro-deposition layer may be executed by connecting the wiring layer b to the cathode.

The mechanism of depositing the mixed electro-deposition layer is considered as follows.

Although the colloid particles in the inorganic filler are electrically neutral and have no polarity, the colloid particles of the polyimide resin having positive polarity serves as a cation. The colloid particles in the electrolytic solution are considered to be in a state where the colloid particles of the inorganic filler are attracted and aggregated to the colloid particles of the polyimide resin. Therefore, the electrophoresis causes the colloid particles of the filler particles to migrate together with the colloid particles of the polyimide resin until reaching the cathode side of the substrate, to thereby form the mixed electro-deposition layer.

The dielectric layer Y can be formed with a desired thickness by adjusting the amount (value) of applied voltage and the time of applying voltage. For example, the dielectric layer Y may be formed into an extremely thin layer with a thickness of no more than 10 µm.

Ceramic powder having a perovskite structure may be suitably employed as the inorganic filler having a high dielectric constant, for example, barium titanate ($BaTiO_3$), lead zirconate titanate ($Pb(Zr_xTi_{1-x})O_3$), or strontium titanate ($SrTiO_3$). Furthermore, the inorganic filler having high dielectric constant is mixed with a paraelectric filler having a temperature coefficient which is a negative (minus) value or no more than 100 ppm/° C. The material of the paraelectric filler may comprise, for example, the materials listed in the table shown in FIG. 13. The material of the paraelectric filler employed in this embodiment of the present invention is calcium titanate ($CaTiO_3$) having an extremely small temperature coefficient value of −1500 ppm/° C. or magnesium titanate ($MgTiO_3$) having a temperature coefficient value of 100 ppm/° C. By employing such materials for the mixture of the high dielectric constant filler and paraelectric filler, the temperature coefficient of the dielectric layer Y can be reduced considerably. The reduction of temperature coefficient prevents capacitance change rate from changing in correspondence with temperature change, to thereby stabilize temperature characteristics.

Furthermore, by mixing the paraelectric filler with the high dielectric constant filler, the dielectric layer Y is able to reduce dielectric loss and attain a satisfactory capacity/temperature characteristic and distortion factor like a paraelectric material. Therefore, hardly any capacity change occurs when DC bias is applied and voltage dependency can be stabilized. Accordingly, the capacitor structure X including the dielectric layer Y is also able to attain the above-described characteristics of a paraelectric material by the mixing of the paraelectric filler.

It is to be noted that the proportion of the mixture in the dielectric layer Y according to an embodiment of the present invention is, for example, 60-65% of high dielectric constant inorganic filler (barium titanate), 15-20% of magnesium titanate ($MgTiO_3$), and polyimide resin of 20%. In the conventional example, the proportion of the mixture in the dielectric layer Y is 60-65% of high dielectric constant inorganic filler (barium titanate) and 35-40% of polyimide resin.

Although the polyimide resin itself has a dielectric property, by being mixed with the inorganic filler having high dielectric constant, the dielectric layer Y comprising the mixed electro-deposition layer is able to attain an extremely high dielectric constant and a thin dielectric layer with a large capacitor capacitacity can be obtained.

[Step 7]

Figure 10:
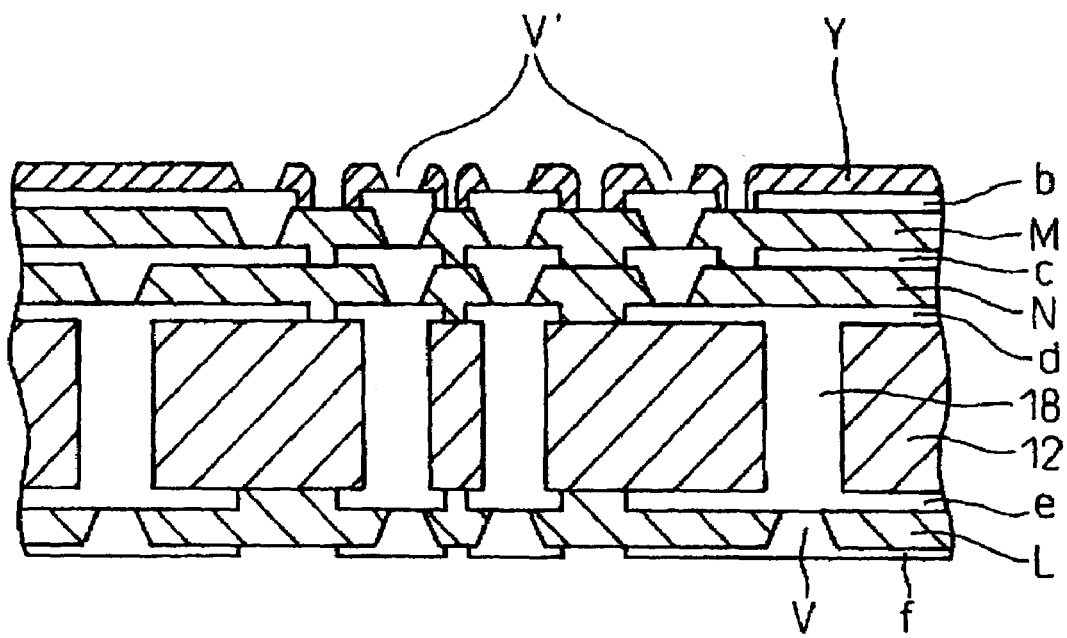
FIG. 10 is a cross-sectional view for describing Step 7 in manufacturing a multilayer wiring substrate and a semiconductor device according to an embodiment of the present invention.

Formation of Via Holes in Dielectric Layer (See FIG. 10)

Then, via holes V' are opened in the dielectric layer Y, for example, by using a laser. The via holes V' includes the via holes for forming the conductor layer R shown in FIG. 3. The laser includes, for example, a UV-YAG laser, a $CO_2$ laser, and an excimer laser. As an alternative method for forming the via holes, a mechanical drilling method may be used.

[Step 8]

Figure 11:
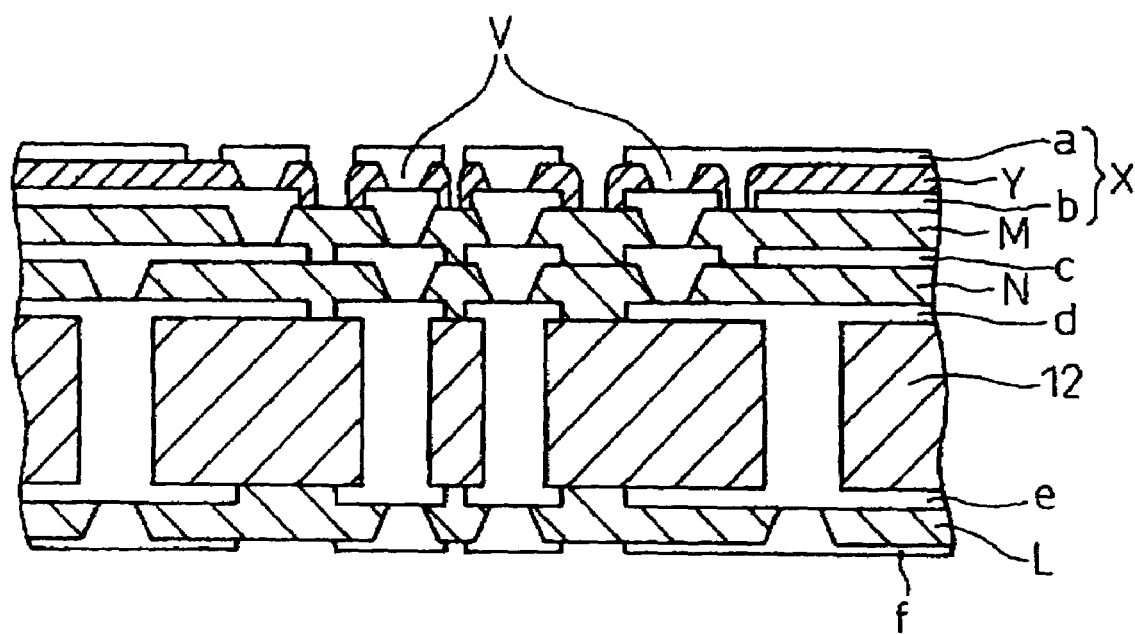
FIG. 11 is a cross-sectional view for describing Step 8 in manufacturing a multilayer wiring substrate and a semiconductor device according to an embodiment of the present invention.

Formation of Upper Electrodes (See FIG. 11)

A thin conductor layer (thin conductor layer for supplying electricity) is formed at the upper face of the configuration shown in FIG. 10 by using, for example, an electro copper plating method or a sputtering method. Then, by using an electro copper plating method, the via holes V' are filled with a conductor and a conductor layer is formed on the upper face of the configuration shown in FIG. 10. The conductor layer is patterned by using an etching method, to thereby fabricate a wiring layer a at the uppermost face of the configuration shown in FIG. 10. Portions of the wiring layer a serves as the upper electrodes of the capacitor structure X. Predetermined areas of the wiring layer a are electrically connected to the wiring layers situated therebelow via the via holes V' that are filled with the conductor.

Furthermore, the element connection pads bP, which are partitioned by the annular insulating layers T (see FIG. 3), are formed at the predetermined areas of the wiring layer a. The element connection pads bP are formed by etching the wiring layer a into the shape of the annular insulating layer T during the patterning process and filling the etched areas with a solder resist layer 19. Accordingly, the portions of the wiring layer a which are surrounded by the annular insulating layers T are element connection pads bP. The lower part of the element connection pads are formed as a part of the conductor layers R (via holes) penetrating the dielectric layer. The lower end thereof is connected to the predetermined areas of the connection pads bp' of the lower electrode layer b.

Thereby, the capacitor structure X including the upper electrode a, the dielectric layer Y, and the lower electrode b.

[Step 9]

Figures 12, 13:
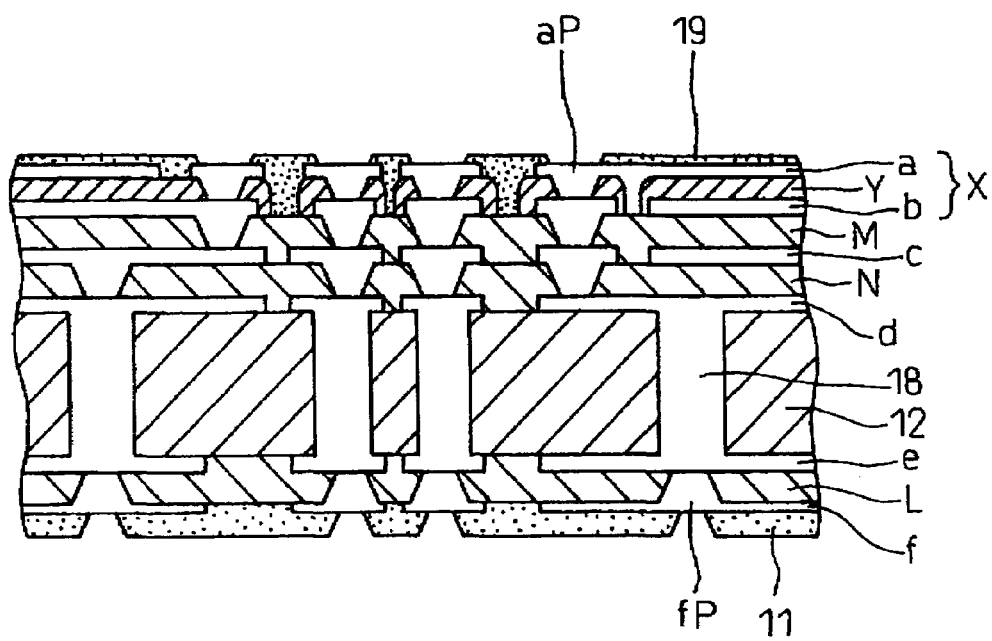
FIG. 12 is a cross-sectional view for describing Step 9 in manufacturing a multilayer wiring substrate and a semiconductor device according to an embodiment of the present invention.
FIG. 13 is a list showing paraelectric materials having low temperature coefficient.

Formation of Solder Resist Layer (See FIG. 12)

The solder resist layers 11 and 19 are formed on the upper and lower faces of the configuration shown in FIG. 11 except at areas where the element connection pads aP and fP are situated. In fabricating the solder resist layers 11 and 19, the solder resist layers 11 and 19 may be formed entirely on the upper and lower faces by using, for example, a printing method or a thermocompression bonding method (e.g. vacuum thermal pressing method), and then patterned to form openings at which the pads aP and fP are to be formed.

Then, by connecting the pad fP of the lower face to the external connection terminals (pins) 13 via the solder parts 15 (as shown in FIG. 2), the fabrication of the multilayer wiring substrate 10 according to an embodiment of the present invention is completed.

Furthermore, by mounting the semiconductor chip 20 on the upper face of the multilayer wiring substrate 10, the fabrication of the semiconductor device 30 is completed. The mounting is performed by connecting the pads aP and bP on the upper face to the electrode bumps of the semiconductor chip 20 via the solder parts 17.

Although the fabrication of wiring layers in the above-described embodiment of the present invention is executed by employing a subtractive method (forming an entire layer is formed and then removing unnecessary areas by patterning), an additive method (forming only necessary areas by masking deposition) may alternatively be employed.

Further, the present invention is not limited to these embodiments, but variations and modifications may be made without departing from the scope of the present invention.

The present application is based on Japanese Priority Application No. 2004-145383 filed on May 14, 2004, with the Japanese Patent Office, the entire contents of which are hereby incorporated by reference.

What is claimed is:

1. A multilayer wiring substrate for providing a capacitor structure inside a multilayer wiring structure, the multilayer wiring substrate comprising:

a dielectric layer including a resin material mixed with an inorganic filler;

wherein the inorganic filler is fabricated by mixing a paraelectric filler with an inorganic filler having a high dielectric constant;

wherein the paraelectric filler has a temperature coefficient that is a negative value or a temperature coefficient that is no more than 100 ppm/° C. and the paraelectric filler is selected from the group consisting of $2MgO \cdot SiO_2$—$SrO$—$BaO$—$TiO_2$, $La_2O_3 \cdot 2TiO_3$, $Bi_2O_3 \cdot 2TiO_2$, $CaTiO_3$—$La_3O_3$—$TiO_2$, $SrTiO_3$—$CaTiO_3$, $BaTiO_3$—$SrTiO_3$—$La_2O_3$—$TiO_2$, and admixtures thereof.

2. The multilayer wiring substrate as claimed in claim 1, further comprising:

an upper electrode formed above the dielectric layer; and
a lower electrode formed below the dielectric layer.

3. The multilayer wiring substrate as claimed in claim 1, wherein the inorganic filler having a high dielectric constant includes at least one of barium titanate, lead zirconate titanate, and strontium titanate.

4. The multilayer wiring substrate as claimed in claim 1, wherein the resin material includes an insulating resin made of polyimide resin.

5. A capacitor structure comprising:

a dielectric layer including
a resin material;
the paraelectric filler selected from the group consisting of $2MgO \cdot SiO_2$—$SrO$—$BaO$—$TiO_2$, $La_2O_3$—$2TiO_3$, $Bi_2O_3 \cdot 2TiO_2$, $CaTiO_3$—$La_3O_3$—$TiO_2$, $SrTiO_3$—$CaTiO_3$, $BaTiO_3$—$SrTiO_3$—$La_2O_3$—$TiO_2$, and admixtures thereof; and
a high dielectric constant inorganic filler,
wherein relative amounts of the paraelectric filler and the high dielectric constant inorganic filler are configured to reduce a change in capacitance as a function of temperature of the dielectric layer, whereby the capacitor structure having a relatively constant capacitance as a function of temperature.

6. The capacitor structure of claim 5, further comprising:
an upper electrode formed above the dielectric layer; and
a lower electrode fomied below the dielectric layer.

7. The capacitor structure of claim 5, wherein the paraelectric filler has a negative change in capacitance as a function of temperature.

8. The capacitor structure of claim 5, wherein the paraelectric filler has no more than a 100 ppm/° C. change in capacitance as a function of temperature.

9. The capacitor structure of claim 5 wherein the paraelectric filler is selected from the group consisting of calcium titanate, magnesium titanate and admixtures thereof.

10. The capacitor structure of claim 5, wherein the high dielectric constant inorganic filler is selected from the group consisting of barium titanate, lead zirconate titanate, strontium titanate, and admixtures thereof.

11. The capacitor structure of claim 5, wherein the resin material is selected from the group consisting of epoxy resin, polyimide resin, BT (bismaleimide Triazine) resin, and PPE (polyphenylene-ether) resin.

12. The capacitor structure of claim 5, wherein the dielectric layer is formed as a thin layer having a thickness of no more than 10 μm, whereby enabling installment of the capacitor structure inside a multilayer wiring substrate.

13. A capacitor structure comprising:
   a dielectric layer including
      a resin material wherein the resin material is selected from the group consisting of epoxy resin, polyimide resin, BT (bismaleimide Triazine) resin, and PPE (polyphenylene-ether) resin;
      a paraelectric filler selected from the group consisting of $2MgO \cdot SiO_2$—$SrO$—$BaO$—$TiO_2$, $La_2O_3 \cdot 2TiO_3$, $Bi_2O_3 \cdot 2TiO_2$, $CaTiO_3$—$La_3O_3$—$TiO_2$, $SrTiO_3$—$CaTiO_3$, $BaTiO_3$—$SrTiO_3$—$La_2O_3$—$TiO_2$, and admixtures thereof; and
      a high dielectric constant inorganic filler wherein the high dielectric constant inorganic filler is selected from the group consisting of barium titanate, lead zirconate titanate, strontium titanate, and admixtures thereof,
      wherein relative amounts of the parselectric filler and the high dielectric constant inorganic filler are configured to reduce a change in capacitance as a function of temperature of the dielectric layer, whereby the capacitor structure has a relatively constant capacitance as a function of temperature;
   an upper electrode formed above the dielectric layer; and
   a lower electrode formed below the dielectric layer.

14. The capacitor structure of claim 13, wherein the dielectric layer is formed as a thin layer having a thickness of no more than 10 μm, whereby enabling installment of the capacitor structure inside a multilayer wiring substrate.

* * * * *